United States Patent [19]

Obuchi et al.

[11] Patent Number: 5,344,536
[45] Date of Patent: Sep. 6, 1994

[54] METHOD OF AND APPARATUS FOR PROCESSING A WORKPIECE IN PLASMA

[75] Inventors: Kazuto Obuchi; Satoshi Oya; Mitsuaki Minato; Akira Uehara; Kazutoshi Fujisawa; Kazuhisa Takao, all of Kanagawa, Japan

[73] Assignee: Tokyo Ohka Kogyo Co., Ltd., Kanagawa, Japan

[21] Appl. No.: 984,518

[22] Filed: Dec. 2, 1992

[30] Foreign Application Priority Data

Dec. 3, 1991 [JP] Japan .................................. 3-347944

[51] Int. Cl.$^5$ ............................................. H01L 21/02
[52] U.S. Cl. ........................ 204/192.32; 204/298.16; 204/298.31; 204/298.36; 156/345; 156/643; 219/76.16; 219/121.41; 315/111.21
[58] Field of Search ................. 204/192.32, 298.34, 204/298.37, 298.38, 298.16, 298.31, 298.36; 315/111.21; 118/723, 728; 427/99, 238; 156/345, 643; 219/76.16, 121.41

[56] References Cited

U.S. PATENT DOCUMENTS

| | | | |
|---|---|---|---|
| 4,585,541 | 4/1986 | Miyake et al. | 204/298.37 |
| 4,662,977 | 5/1987 | Motley et al. | 204/298.36 |
| 4,970,435 | 11/1990 | Tanaka et al. | 204/298.38 |
| 5,124,014 | 6/1992 | Foo et al. | 204/298.34 |
| 5,210,466 | 5/1993 | Collins et al. | 204/298.34 |

*Primary Examiner*—Anthony McFarlane
*Attorney, Agent, or Firm*—Irving M. Weiner; Joseph P. Carrier; Pamela S. Burt

[57] ABSTRACT

An electron cyclotron resonance plasma chemical vapor deposition system has a reaction chamber for introducing a reaction gas therein, the reaction chamber housing a table for supporting a semiconductor wafer. A microwave oscillator is connected to the reaction chamber through a waveguide for generating and introducing a microwave into the reaction chamber to produce a plasma in the reaction chamber for activating the reaction gas to etch or deposit a film on the semiconductor wafer in the reaction chamber. A pair of upper and lower coils is disposed around the reaction chamber for generating respective magnetic fields in opposite directions in the reaction chamber. The magnetic fields cancel out each other creating a region with substantially no flux density in the magnetic fields between the coils. A bias voltage is applied to the table to attract the plasma to the table in a uniform manner.

20 Claims, 3 Drawing Sheets

METHOD OF AND APPARATUS FOR PROCESSING A WORKPIECE IN PLASMA

BACKGROUND OF THE INVENTION

1. Field of the Invention

The present invention relates to a method of and an apparatus for processing a workpiece in a plasma, e.g., etching a wafer in a plasma, or depositing a layer on a wafer in a plasma by way of chemical vapor deposition (CVD).

2. Description of the Relevant Art

There are known plasma processing apparatus which generate a plasma to activate a reaction gas for etching a wafer or depositing a layer on a wafer by way of CVD. One such plasma processing apparatus is known as an electron cyclotron resonance (ECR) plasma CVD system that produces a high-density plasma in a high vacuum with electrons moving in cyclotron orbit in the presence of a magnetic field and a microwave for etching or otherwise processing workpieces highly accurately and efficiently. The ECR plasma CVD system generally has a reaction chamber disposed in a casing connected to a waveguide coupled to a microwave oscillator, and a coil disposed around the reaction chamber for generating a magnetic field in the reaction chamber.

Conventional plasma processing apparatus are disclosed in U.S. Pat. Nos. 4,298,419; 4,330,384; 4,430,138; 4,462,863; 4,559,100; and 4,705,595, or example.

FIGS. 1 (a) and 1 (b) of the accompanying drawings show the manner in which a magnetic field affects a plasma generated in a conventional ECR plasma CVD system. As shown in FIG. 1 (a), the plasma is constricted into a high-density state within a coil 11 because the plasma tends to avoid a region where the flux density is high. Outside of the coil 11, however, the flux density is lower as shown in FIG. 1 (b). Consequently, the plasma as it reaches a wafer W on a table 13 outside of the coil 11 is relatively uneven while the wafer W is being etched, causing an undercut in a peripheral edge of the wafer W or etching the surface of the wafer W at different etching rates.

Another known ECR plasma CVD system, shown in FIGS. 2 (a) and 2 (b) of the accompanying drawings, has upper and lower coils 11, 12 arranged successively along the axial direction of a reaction chamber for further constricting a plasma generated in the reaction chamber. The ECR plasma CVD system shown in FIGS. 2(a) and 2(b) is however unable to fully prevent the plasma from being uneven at the wafer W.

SUMMARY OF THE INVENTION

It is an object of the present invention to provide an apparatus for processing a workpiece in a plasma that is uniformly applied to the workpiece.

Another object of the present invention is to provide a method of processing a workpiece in a plasma that is uniformly applied to the workpiece.

According to the present invention, there is provided an apparatus for processing a workpiece in a plasma, comprising a reaction chamber for introducing a reaction gas therein, microwave generating means for generating and introducing a microwave into the reaction chamber to produce a plasma therein for activating the reaction gas to process a workpiece in the reaction chamber, and magnetic field generating means for generating a magnetic field in the reaction chamber while creating a region with substantially no flux density in the magnetic field. The magnetic field generating means may comprise a pair of upper and lower coils for jointly generating the magnetic field, the region being positioned between the upper and lower coils.

According to the present invention, there is also provided an apparatus for processing a semiconductor device in a plasma, comprising a reaction chamber for introducing a reaction gas therein, a table disposed in the reaction chamber for supporting a semiconductor device thereon, a microwave oscillator connected to the reaction chamber for generating and introducing a microwave into the reaction chamber to produce a plasma in the reaction chamber for activating the reaction gas to process the semiconductor device in the reaction chamber, magnetic means disposed around the reaction chamber for generating a magnetic field in the reaction chamber while creating a region with substantially no flux density in the magnetic field, and biasing means for applying a bias voltage to the table. The magnetic field generating means may comprise a pair of coils for generating respective oppositely directed magnetic fields which are combined into the magnetic field in the reaction chamber the oppositely directed magnetic fields canceling out each other to create the no flux region between the coils.

According to the present invention, there is further provided a method of processing a workpiece in a plasma, comprising the steps of introducing a reaction gas in a reaction chamber, introducing a microwave into the reaction chamber to produce a plasma therein for activating the reaction gas to process a workpiece supported on a table in the reaction chamber, and generating a magnetic field in the reaction chamber while creating a region with substantially no flux density in the magnetic field.

According to the present invention, there is further provided a method of processing a workpiece in a plasma, comprising the steps of introducing a reaction gas in a reaction chamber, introducing a microwave into the reaction chamber to produce a plasma therein for activating the reaction gas to process a workpiece supported on a table in the reaction chamber, and energizing a pair of coils disposed around the reaction chamber to generate respective magnetic fields in opposite directions in the reaction chamber, the magnetic fields partially canceling out each other creating a region with substantially no flux density in the magnetic fields between the coils.

The coils are energized by respective currents flowing in opposite directions to produce respective magnetic fields. The magnetic fields cancel out each other in the region between the coils. The plasma, which is directionally uncontrolled in the region, is attracted evenly toward the table by the bias voltage applied to the table.

The above and further objects, details and advantages of the present invention will become apparent from the following detailed description of preferred embodiments thereof, when read in conjunction with the accompanying drawings.

DETAILED DESCRIPTION OF THE PREFERRED EMBODIMENT

Figure 1:
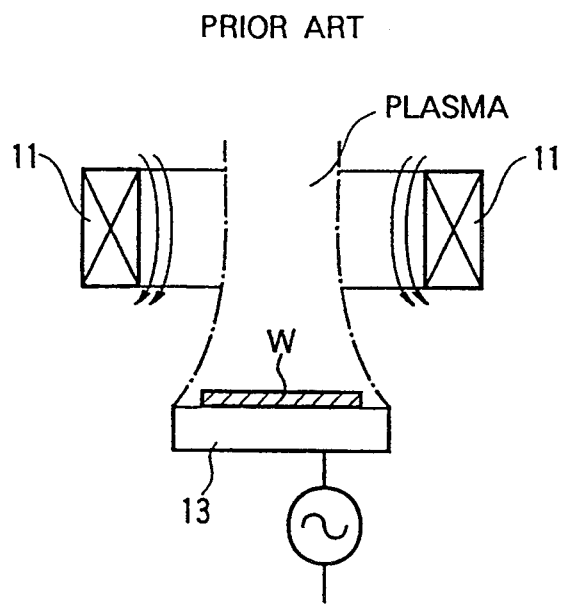
FIGS. 1(a) and 1(b) show the manner in which a magnetic field affects a plasma generated by a conventional ECR plasma CVD system.
Figure 1:
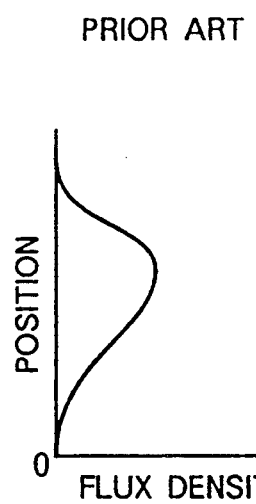
Figure 2:
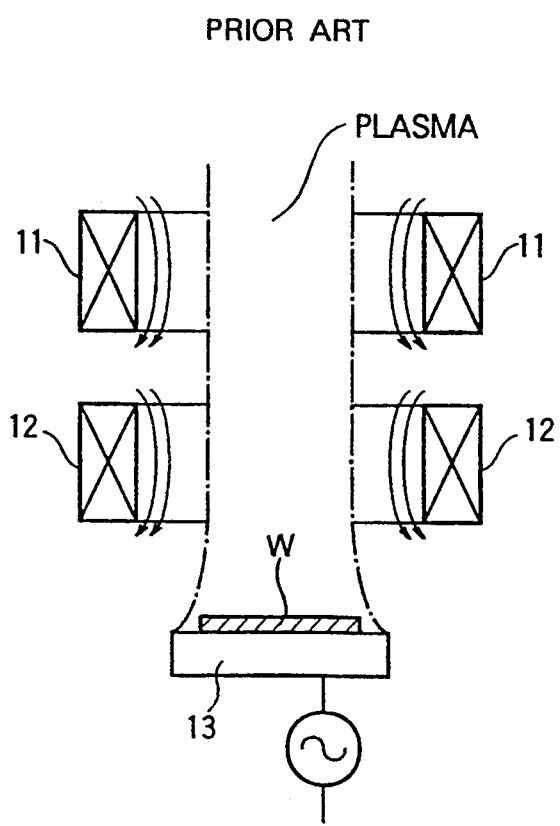
FIGS. 2(a) and 2(b) show the manner in which a magnetic field affects a plasma generated by another conventional ECR plasma CVD system.
Figure 2:
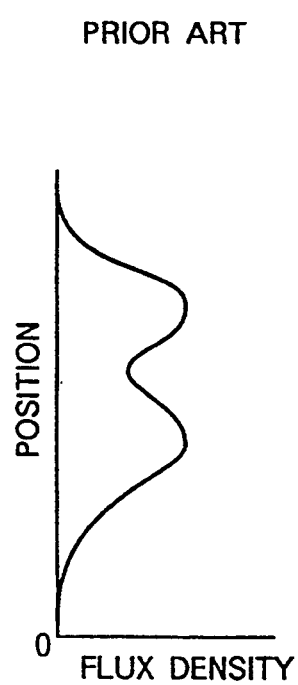
Figure 3:
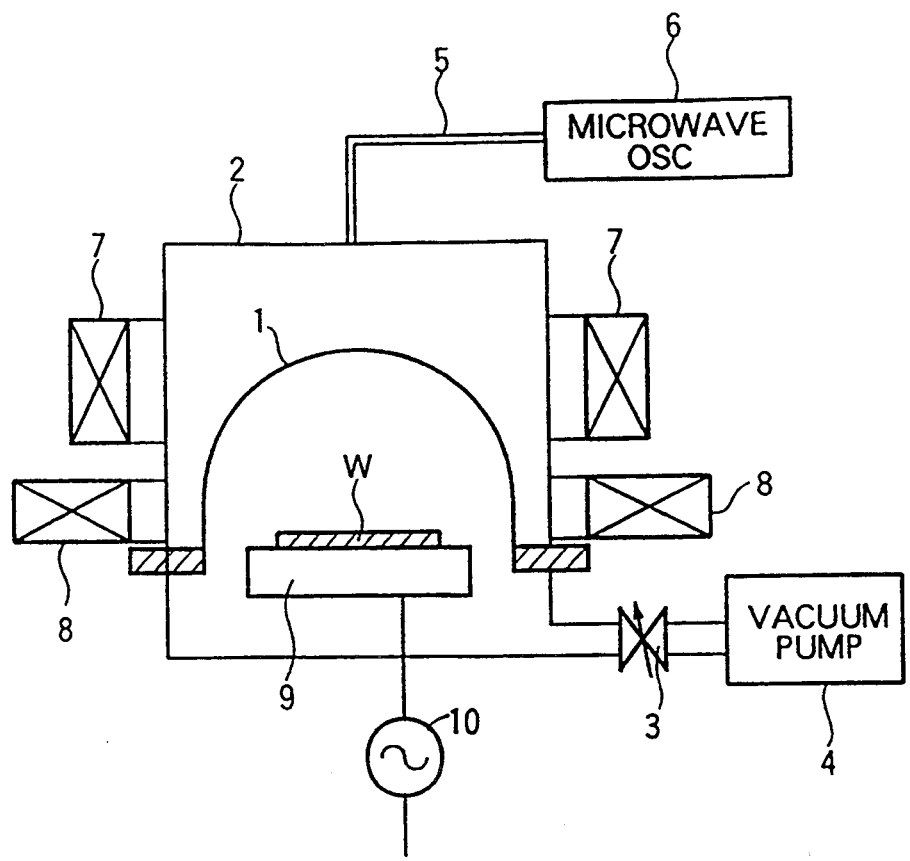
FIG. 3 is a schematic cross-sectional view of a plasma processing apparatus according to the present invention.

As shown in FIG. 3, a plasma processing apparatus according to the present invention, which is illustrated as an ECR plasma CVD system, has a reaction chamber 1 disposed in a casing 2 which is connected to a vacuum pump 4 through a valve 3. The casing 2 is also connected through a waveguide 5 to a microwave oscillator 6 which generates a microwave at a frequency of 2.45 GHz. The generated microwave is introduced through the waveguide 5 into the reaction chamber 1. The plasma processing apparatus also includes a pair of vertically spaced, upper and lower coils 7, 8 disposed coaxially around the casing 2 for jointly generating a magnetic field. The lower coil 8 is flatter, i.e., has a smaller vertical dimension, than the upper coil 7. The reaction chamber 1 houses a table 9 for supporting a wafer W thereon, the table 9 being horizontally positioned within the lower coil 8. A high-frequency bias voltage source 10 is connected to the table 9 for applying a bias voltage having a frequency of 13.56 MHz to the table 9. The high-frequency bias voltage source 10 is energizable independently of the microwave oscillator 6 so that the bias voltage can be applied to the table 9 independently of the microwave applied to the casing 2.

The plasma processing apparatus operates as follows:

The vacuum pump 4 is actuated to evacuate the casing 2, and a reaction gas is introduced into the reaction chamber 1, the plasma processing apparatus including coventional means (not shown) for introducing the reaction gas into the reaction chamber and the vacuum pump 4 removes exhaust gas. The coils 7, 8 are energized by power supplies (not shown), and the microwave oscillator 6 is energized to introduce a microwave of 2.45 GHz through the waveguide 5 into the reaction chamber 1. A plasma is now generated in the reaction chamber 1 to activate the reaction gas for thereby etching the wafer W or depositing a layer on the wafer W by way of CVD.

Figure 4:
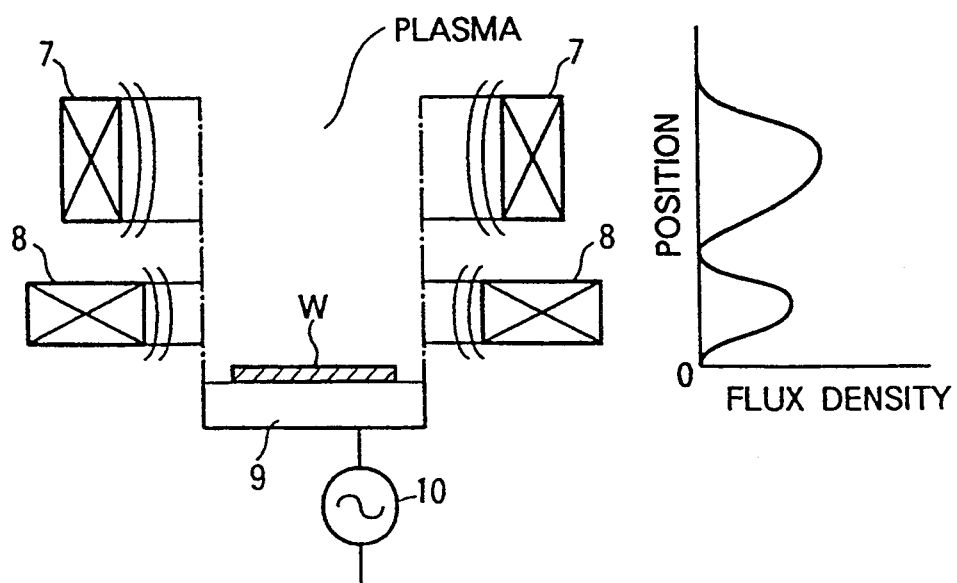
FIGS. 4(a) and 4(b) show the manner in which a magnetic field affects a plasma generated by the plasma processing apparatus according to the present invention.

The coils 7, 8 are energized in opposite directions. That is, electric currents are supplied to flow through the coils 7, 8 in opposite directions. Consequently, the coils 7, 8 produce respective magnetic fields in opposite directions, and the produced magnetic fields cancel out each other in a boundary region between the coils 7, 8. Since the flux density in the boundary region between the coils 7, 8 is substantially nil, as shown in FIGS. 4(a) and 4(b), the plasma loses its directional control between the coils 7, 8. However, below the boundary region of zero flux density between the coils 7, 8, the plasma is attracted downwardly to the table 9 without spreading outwardly by the bias voltage which is applied to the table 9 by the bias voltage supply 10. The flatter lower coil 8 is effective to position the region of zero flux density closer to the wafer W on the table 9. The table 9 is positioned in a region below the lower coil 8 where the flux density is substantially zero, as shown in FIGS. 4(a) and 4(b).

Since the plasma thus attracted downwardly by the bias voltage applied to the table 9 does not spread outwardly, the plasma applied to the wafer W is uniform. When the wafer W is etched in the plasma, it can be etched at a uniform etching rate over its surface, and can also be anisotropically etched. When a layer is deposited on the wafer W in the plasma by CVD, it can be deposited to a uniform thickness over the entire surface of the wafer W.

Figure 5:
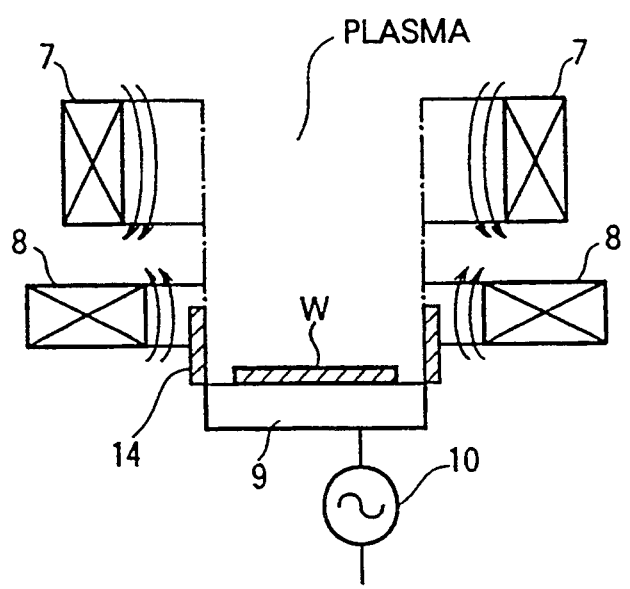
FIG. 5 is a schematic cross-sectional view of a modified plasma processing apparatus according to the present invention.

FIG. 5 shows a modified plasma processing apparatus in which a ring 14 is disposed around and extends upwardly from the table 9 for preventing the plasma from becoming uneven on the table 9. The ring 14 serves to keep the wafer W on the table 9 electrically away or isolated from the ground.

Although there has been described what is at present considered to be the preferred embodiment of the invention, it will be understood that the invention may be embodied in other specific forms without departing from the essential characteristics thereof. The present embodiment is therefore to be considered in all respects as illustrative, and not restrictive. The scope of the invention is indicated by the appended claims rather than by the foregoing description.

What is claimed is:

1. An apparatus for processing a workpiece in a plasma, comprising:

a reaction chamber adapted to have a reaction gas introduced therein and exhausted therefrom;

microwave generating means for generating and introducing a microwave into said reaction chamber to produce a plasma therein for activating the reaction gas to process a workpiece in said reaction chamber; and magnetic field generating means for generating a magnetic field in said reaction chamber while creating a region with substantially no flux density in said magnetic field wherein said plasma is uniformly applied to said workpiece.

2. An apparatus according to claim 1, wherein said magnetic field generating means comprises a pair of upper and lower coils for jointly generating said magnetic field, said region being positioned between said upper and lower coils.

3. An apparatus according to claim 2, wherein said lower coil is flatter than said upper coil.

4. An apparatus according to claim 1, further comprising a table disposed in said reaction chamber inside of said lower coil for supporting the workpiece thereon.

5. An apparatus according to claim 4, further comprising means for applying a bias voltage to said table.

6. An apparatus according to claim 4, further comprising a ring disposed around said table.

7. An apparatus according to claim 4, wherein said magnetic field generating means comprises a pair of upper and lower coils for jointly generating said magnetic field, and said table is positioned in a region below said lower coil where there is substantially no flux density.

8. An apparatus according to claim 2, wherein said upper and lower coils are energized to produce respective magnetic fields in opposite directions.

9. An apparatus for processing a semiconductor device in a plasma, comprising:

a reaction chamber for introducing a reaction gas therein;

a table disposed in said reaction chamber for supporting a semiconductor device thereon;

a microwave oscillator connected to said reaction chamber for generating and introducing a microwave into said reaction chamber to produce a plasma in said reaction chamber for activating the reaction gas to process the semiconductor device in said reaction chamber;

magnetic means disposed around said reaction chamber for generating a magnetic field in said reaction chamber while creating a region with substantially no flux density in said magnetic field wherein said plasma is uniformly applied to said workpiece; and biasing means for applying a bias voltage to said table.

10. An apparatus according to claim 9, wherein said magnetic means comprises a pair of coils for generating respective oppositely directed magnetic fields which are combined into said magnetic field in said reaction chamber, said pair of coils being adapted to generate said oppositely directed magnetic fields such that they cancel out each other to create said region between said coils.

11. An apparatus according to claim 10, wherein one of said coils is flatter than the other of said coils.

12. An apparatus according to claim 11, wherein said table is positioned in a region below said one of the coils where there is substantially no flux density.

13. An apparatus according to claim 9, further comprising a ring disposed around said table.

14. A method of processing a workpiece in a plasma, comprising the steps of:

introducing a reaction gas into a reaction chamber;

introducing a microwave into said reaction chamber to produce a plasma therein for activating the reaction gas;

processing a workpiece supported on a table in said reaction chamber with the activated reaction gas; and generating a magnetic field in said reaction chamber while creating a region with substantially no flux density in said magnetic field wherein said plasma is uniformly applied to said workpiece.

15. A method according to claim 14, further comprising the step of:

applying a bias voltage to said table.

16. A method according to claim 14, wherein said step of generating a magnetic field in said reaction chamber comprises generating oppositely directed magnetic fields which are combined into said magnetic field in said reaction chamber, said oppositely directed magnetic fields canceling out each other to create said region with substantially no flux density.

17. A method of processing a workpiece in a plasma, comprising the steps of:

introducing a reaction gas in a reaction chamber;

introducing a microwave into said reaction chamber to produce a plasma therein for activating the reaction gas;

processing a workpiece supported on a table in said reaction chamber with the activated reaction gas; and energizing a pair of coils disposed around said reaction chamber to generate respective magnetic fields in opposite directions in said reaction chamber, said magnetic fields cancelling out each other creating a region with substantially no flux density in said magnetic fields between said coils wherein said plasma is uniformly applied to said workpiece.

18. A method according to claim 17, further comprising the step of:

applying a bias voltage to said table.

19. A method according to claim 15, comprising further a step of: electrically isolating said table from ground.

20. A method according to claim 18, comprising further a step of: electrically isolating said table from ground.

* * * * *

UNITED STATES PATENT AND TRADEMARK OFFICE
CERTIFICATE OF CORRECTION

PATENT NO. : 5,344,536
DATED : September 6, 1994
INVENTOR(S) : Obuchi et al.

It is certified that error appears in the above-indentified patent and that said Letters Patent is hereby corrected as shown below:

Column 1, line 30, change "or" to --for--.

Column 2, line 24, after "chamber" insert a comma.

Column 3, line 44, change "coventional" to --conventional--.

Signed and Sealed this

Eighth Day of November, 1994

Attest:

BRUCE LEHMAN

*Attesting Officer*  *Commissioner of Patents and Trademarks*